United States Patent
Nakagawa et al.

(10) Patent No.: US 7,563,706 B2
(45) Date of Patent: Jul. 21, 2009

(54) MATERIAL FOR FORMING INSULATING FILM WITH LOW DIELECTRIC CONSTANT, LOW DIELECTRIC INSULATING FILM, METHOD FOR FORMING LOW DIELECTRIC INSULATING FILM AND SEMICONDUCTOR DEVICE

(75) Inventors: Hideo Nakagawa, Shiga (JP); Masaru Sasago, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/798,085

(22) Filed: May 10, 2007

(65) Prior Publication Data
US 2007/0218643 A1  Sep. 20, 2007

Related U.S. Application Data

(62) Division of application No. 10/437,299, filed on May 14, 2003, now abandoned.

(30) Foreign Application Priority Data

May 14, 2002  (JP) .............................. 2002-137893

(51) Int. Cl.
*H01L 21/4763* (2006.01)
(52) U.S. Cl. .................. 438/623; 438/404; 438/624; 257/783
(58) Field of Classification Search .............. 438/623, 438/778, 404; 257/783, 787, 759, E21.092, 257/E21.115, E21.606, E21.696
See application file for complete search history.

(56) References Cited

U.S. PATENT DOCUMENTS

| 6,261,357 | B1 | 7/2001 | Egami et al. |
| 6,313,045 | B1* | 11/2001 | Zhong et al. ............... 438/758 |
| 6,562,465 | B1 | 5/2003 | Nakashima et al. |
| 6,639,015 | B1* | 10/2003 | Nakashima et al. ......... 525/106 |
| 6,716,773 | B2 | 4/2004 | Egami et al. |
| 6,780,498 | B2 | 8/2004 | Nakata et al. |
| 2002/0134995 | A1 | 9/2002 | Yan et al. |
| 2005/0263908 | A1* | 12/2005 | Nakagawa et al. .......... 257/783 |

FOREIGN PATENT DOCUMENTS

| EP | 0 512 401 A2 | 11/1902 |
| JP | 4-359056 | 12/1992 |
| JP | 05-182518 | 7/1993 |
| JP | 8-138442 | 5/1996 |
| JP | 8-181133 | 7/1996 |
| JP | 9-241518 | 9/1997 |
| JP | 10-4087 | 1/1998 |
| JP | 11-145572 | 5/1999 |
| JP | 09-315812 | 12/1999 |
| JP | 2000-241831 A | 9/2000 |
| JP | 2001-115029 A | 4/2001 |
| JP | 2001-287910 A | 10/2001 |
| JP | 2001-294815 | 10/2001 |
| JP | 2002-284998 A | 10/2002 |
| JP | 2002-289607 A | 10/2002 |
| JP | 2003-249495 | 9/2003 |
| WO | WO 98/50945 | 11/1998 |

* cited by examiner

*Primary Examiner*—Theresa T Doan
(74) *Attorney, Agent, or Firm*—McDermott Will & Emery LLP

(57) ABSTRACT

A material for forming an insulating film with low dielectric constant of this invention is a solution including a fine particle principally composed of a silicon atom and an oxygen atom and having a large number of pores, a resin and a solvent.

7 Claims, 11 Drawing Sheets

MATERIAL FOR FORMING INSULATING FILM WITH LOW DIELECTRIC CONSTANT, LOW DIELECTRIC INSULATING FILM, METHOD FOR FORMING LOW DIELECTRIC INSULATING FILM AND SEMICONDUCTOR DEVICE

RELATED APPLICATIONS

This application is a divisional of application Ser. No. 10/437,299 filed on May 14, 2003, now abandoned which claims priority of Japanese Application No. 2002-137893, filed May 14, 2002, the contents of which are hereby incorporated by reference.

BACKGROUND OF THE INVENTION

The present invention relates to a material for forming an insulating film with low dielectric constant, an insulating film with low dielectric constant, a method for forming an insulating film with low dielectric constant and a semiconductor device including an insulating film with low dielectric constant.

Recently, a multilayer interconnect structure including an insulating film with low dielectric constant is necessary for realizing refinement, a high-speed operation and a low power consuming operation of a semiconductor device.

A conventional insulating film used in a multilayer interconnect structure is, for example, a silicon oxide film having a dielectric constant of approximately 4.2 or a silicon oxide film doped with fluorine having a dielectric constant of approximately 3.7. Also, in order to further lower the low dielectric constant, an organic component-containing silicon oxide film doped with a methyl group ($CHF_3$) is recently under examination.

It is, however, very difficult to lower the dielectric constant of an organic component-containing silicon oxide film below 2.5, and therefore, an insulating film having pores, namely, what is called a porous film, is necessary.

Now, conventional technique for a porous film will be described.

First, a first conventional example and a second conventional example disclosed in Japanese Laid-Open Patent Publication No. 2001-294815 will be described.

In the first conventional example, a porous film is formed by baking a thin film made from a solution including a silicon resin and an organic solvent. In this example, open pores are randomly formed in portions where the organic solvent has been vaporized in baking the thin film. In this case, the organic solvent has a function as a solvent as well as a function to form the pores. In general, a spin coating method is employed for forming the thin film by applying the solution on a substrate, and a hot plate and a furnace (electric furnace) are used for baking the thin film.

In the second example, a porous film is formed by baking a thin film made from a solution including not only a silicon resin and an organic solvent but also a porogen of an organic substance. In this example, not only open pores but also closed pores can be formed through selection of the porogen. In this case, the porogen is naturally vaporized to disappear from the resultant film.

Next, a third conventional example disclosed in Japanese Laid-Open Patent Publication No. 8-181133 will be described.

A porous film of the third conventional example has conceptually the most general structure and is formed by using a solution as shown in FIG. 9. Specifically, as shown in FIG. 9, a solution in which a silicon resin 102, a porogen 103 and a solvent 104 are mixed is contained in a vessel 101.

In the third conventional example, which is disclosed in Japanese Laid-Open Patent Publication No. 8-181133, a porous film is formed by baking a thin film made from a solution including a fullerene such as C60 or C70, a silicon resin and an organic solvent. In this case, a hollow portion of the fullerene becomes a pore of the porous film.

As the silicon resin used in the first, second and third conventional examples, an organic silicon resin such as methylsilsesquioxane capable of lowering the dielectric constant as compared with an inorganic silicon resin is used.

Now, an exemplified conventional method for forming a thin film from a solution will be described with reference to FIGS. 10A through 10F. In general, a substrate on which a thin film has been formed by the spin coating method is baked with a hot plate or an electric furnace.

First, as shown in FIG. 10A, a semiconductor wafer 112 is placed on a spindle 111 connected to a rotation mechanism, and thereafter, an appropriate amount of solution 114 used for forming a porous film is dropped on the semiconductor wafer 112 from a solution supply tube 113.

Next, as shown in FIG. 10B, the spindle 111 is rotated so as to rotate the semiconductor wafer 112, and thus, the solution 114 is spread so as to form a thin film 115.

Then, as shown in FIG. 10C, the semiconductor wafer 112 on which the thin film 115 has been formed is placed on and annealed with a hot plate 116 so as to vaporize the solvent. This procedure is generally designated as pre-bake and is performed at a temperature of approximately 100° C. for approximately 1 through 3 minutes.

Next, as shown in FIG. 10D, the semiconductor wafer 112 is placed on a hot plate 117 to be annealed at a temperature of approximately 200° C. for 1 through 3 minutes. This procedure is generally designated as soft bake.

Thereafter, as shown in FIG. 10E, the resultant semiconductor wafer 112 is placed in an electric furnace 118, and then, the temperature of the electric furnace 118 is increased to approximately 400° C. through 450° C., so that annealing can be performed at the highest set temperature for approximately 1 hour. This procedure is generally designated as hard bake, and when this procedure is completed, a porous film 115A is formed on the semiconductor wafer 112. The hard bake can be performed by using a hot plate. Also, in using some solution, annealing is preferably performed, between the soft bake and the hard bake, with a hot plate at an intermediate temperature between the temperatures of the soft bake and the hard bake for approximately 1 through 3 minutes.

FIG. 10F is an enlarged view of a portion surrounded with an alternate long and short dash line in FIG. 10E. As is understood from FIG. 10F, pores 119 (white portions in the drawing) are formed in the porous film 115A formed on the semiconductor wafer 112.

The mechanical strength of the porous film 115A obtained through nano-indentation evaluation is at most approximately 5 GPa in the Young's modulus. With respect to insulating films that are currently actually used in semiconductor devices, the modulus of a silicon oxide film is approximately 78 GPa, the modulus of a fluorine-containing silicon oxide film is approximately 63 GPa and the modulus of an organic component-containing silicon oxide film is approximately 10 GPa. Thus, the mechanical strength of the porous film 115A is smaller than that of any other insulating film used in a multilayer interconnect structure of a current semiconductor device, and accordingly, a porous film with larger mechanical strength is desired to be developed.

FIG. 11 shows the cross-sectional structure obtained in bonding a wire to a semiconductor device that has a three-layer interconnect structure and uses a conventional porous film as an insulating film. In FIG. 11, a reference numeral 120 denotes a semiconductor wafer, a reference numeral 121 denotes a porous film, reference numerals 122, 124 and 126 denote metal interconnects, reference numerals 123, 125, 126 and 128 denote via plugs and a reference numeral 129 denotes a pad to be connected to an external interconnect.

As shown in FIG. 11, when a wire 130 is bonded to the upper face of the pad 129, a crack is caused in the pad 129 and the multilayer interconnects.

The mechanical strength of the porous film 115A is necessary for retaining multilayered interconnects stacked for forming a multilayer structure as well as in bonding for mounting a chip of a semiconductor device in a package as described above. In the case where an organic component-containing silicon oxide film is used as an insulating film, the mechanical strength is at a level of the very limit of breakdown obtained in employing the current bonding technique, and although the bonding technique is expected to be further developed in the future, development of a porous film with large mechanical strength is of urgent necessity.

In the first and second conventional examples, the open pores are randomly formed. Therefore, in order to realize an insulating film with a dielectric constant k of 2.2 through 2.3, the Young's modulus of approximately 5 GPa or less in the nano-indentation evaluation can be attained at most. This mechanical strength depends upon the method for forming the film in the first or second example. Specifically, the porogen and the solvent are not present but the silicon resin alone is present in the porous film after the bake, and therefore, the mechanical strength of the porous film depends upon the original strength of the silicon resin and the porosity (a ratio occupied by pores in a unit volume). In the first or second conventional example, when the dielectric constant is to be further lowered, the porosity is increased, which further lowers the mechanical strength.

In the third conventional example, although the fullerene remains in the porous film after the bake, the mechanical strength basically depends upon the strength of the silicon resin including the fullerene and hence is at the same level as that attained in the first or second conventional example. Also, when the content of the fullerene exceeds approximately 30 wt %, the fullerenes are connected to each other, and therefore, the mechanical strength is further lowered.

As described so far, a practically usable rigid film cannot be obtained by any of the conventional methods for forming a porous film because there is a limit in the mechanical strength of the structure itself of the porous film of a silicon resin.

Also, a conventional porous film can attain merely mechanical strength much lower than the mechanical strength necessary for a semiconductor device, and when the dielectric constant of the porous film is to be lowered, the mechanical strength is disadvantageously lowered.

As a result, in the case where a conventional porous film is actually used in a multilayer interconnect structure of a semiconductor device, there arise a problem that a semiconductor device with sufficient strength cannot be fabricated and a problem that even when a semiconductor chip can be fabricated, the semiconductor device cannot be completed because it is broken in mounting the chip in a package.

SUMMARY OF THE INVENTION

In consideration of the aforementioned conventional problems, an object of the invention is increasing the mechanical strength of an insulating film with low dielectric constant made of a porous film.

In order to achieve the object, the first material for forming an insulating film with low dielectric constant of this invention includes a solution containing a fine particle that is principally composed of a silicon atom and an oxygen atom and has a large number of pores; a resin; and a solvent.

In using the first material for forming an insulating film with low dielectric constant, an insulating film having a low dielectric constant and large mechanical strength can be easily and definitely formed.

In the first material for forming an insulating film with low dielectric constant, the fine particle preferably has a size more than approximately 1 nm and less than approximately 30 nm.

Thus, when the resultant low dielectric insulating film is provided between metal interconnects, an interconnect groove with a good cross-sectional shape can be formed in the low dielectric insulating film if the metal interconnects are buried interconnects, and a smooth insulating film free from a gap can be formed if the metal interconnects are patterned interconnects.

In the first material for forming an insulating film with low dielectric constant, each of the pores in the fine particle preferably has a size more than approximately 0.5 nm and less than approximately 3 nm.

Thus, a large number of pores can be definitely formed within the fine particle.

In the first material for forming an insulating film with low dielectric constant, the pores in the fine particle may be partially confined or isolated.

In the first material for forming an insulating film with low dielectric constant, the fine particle is preferably formed by mechanically crushing a substance having a plurality of open pores randomly distributed.

Thus, the fine particle having a large number of open pores can be definitely obtained.

In the first material for forming an insulating film with low dielectric constant, the fine particle is preferably formed by mechanically crushing a substance having a large number of closed pores substantially uniformly dispersed.

Thus, the fine particle having a large number of closed pores can be definitely obtained.

In the first material for forming an insulating film with low dielectric constant, the fine particle is preferably synthesized through a chemical reaction.

Thus, the fine particle with a uniform size can be definitely obtained.

In the first material for forming an insulating film with low dielectric constant, the resin is preferably a silicon resin.

Thus, the mechanical strength of the resultant low dielectric insulating film can be further increased.

In this case, the silicon resin preferably includes organic silicon.

Thus, the mechanical strength can be increased as well as the dielectric constant can be lowered in the resultant low dielectric insulating film.

In the first material for forming an insulating film with low dielectric constant, the resin is preferably an organic polymer.

Thus, the dielectric constant of the resultant low dielectric insulating film can be further lowered.

In the first material for forming an insulating film with low dielectric constant, the solution preferably further includes a compound for reinforcing bond between the resin and the fine particle.

Thus, the mechanical strength of the resultant low dielectric insulating film can be further increased.

The second material for forming an insulating film with low dielectric constant of this invention includes a fine particle, and the fine particle is formed by mechanically crushing a substance that is principally composed of a silicon atom and an oxygen atom and has a plurality of open pores randomly distributed, and the fine particle has a large number of pores formed by the plurality of open pores.

In using the second material for forming an insulating film with low dielectric constant, an insulating film having a low dielectric constant and large mechanical strength can be formed. In this case, conditions in the temperature, the pressure and the fabrication atmosphere, which are restricted in using a conventional porous film, are not restricted in the fabrication process for a semiconductor device. Therefore, the degree of freedom in producing the substance having randomly distributed open pores is increased, so that a fine particle with large mechanical strength can be obtained.

The third material for forming an insulating film with low dielectric constant of this invention includes a fine particle, and the fine particle is formed by mechanically crushing a substance that is principally composed of a silicon atom and an oxygen atom and has a large number of closed pores substantially uniformly dispersed, and the fine particle has a large number of pores formed by the closed pores.

In using the third material for forming an insulating film with low dielectric constant, an insulating film having a low dielectric constant and large mechanical strength can be formed. In this case, conditions in the temperature, the pressure and the fabrication atmosphere, which are restricted in using a conventional porous film, are not restricted in the fabrication process for a semiconductor device. Therefore, the degree of freedom in producing the substance having substantially uniformly dispersed closed pores is increased, so that a fine particle with large mechanical strength can be obtained.

The fourth material for forming an insulating film with low dielectric constant of this invention includes a fine particle, and the fine particle is synthesized through a chemical reaction, is principally composed of a silicon atom and an oxygen atom and has a large number of pores.

In using the fourth material for forming an insulating film with low dielectric constant, an insulating film having a low dielectric constant and large mechanical strength can be formed. In this case, conditions in the temperature, the pressure and the fabrication atmosphere, which are restricted in using a conventional porous film, are not restricted in the fabrication process for a semiconductor device. Therefore, the degree of freedom in producing a substance having a large number of pores is increased, so that a fine particle with large mechanical strength can be obtained.

The method for forming an insulating film with low dielectric constant of this invention includes the steps of forming a thin film by applying, on a substrate, a solution including a fine particle principally composed of a silicon atom and an oxygen atom and having a large number of pores, a resin and a solvent; and annealing the substrate for evaporating the solvent, whereby forming an insulating film with low dielectric constant out of the thin film.

In the method for forming an insulating film with low dielectric constant of this invention, the low dielectric insulating film is formed by evaporating the solvent from the thin film made from the solution including the fine particle, the resin and the solvent by annealing the substrate. Therefore, the low dielectric insulating film has a structure in which the fine particle having a large number of pores is introduced into a structure of the resin and hence attains a low dielectric constant and large mechanical strength. Also, when the ratio of the fine particle in the solution is increased, the dielectric constant can be lowered without lowering the mechanical strength.

In the method for forming an insulating film with low dielectric constant, the fine particle preferably has a size more than approximately 1 nm and less than approximately 30 nm.

Thus, when the resultant low dielectric insulating film is provided between metal interconnects, an interconnect groove with a good cross-sectional shape can be formed in the low dielectric insulating film if the metal interconnects are buried interconnects, and a smooth insulating film free from a gap can be formed if the metal interconnects are patterned interconnects.

In the method for forming an insulating film with low dielectric constant, each of the pores in the fine particle preferably has a size more than approximately 0.5 nm and less than approximately 3 nm.

Thus, a large number of pores can be definitely formed within the fine particle.

In the method for forming an insulating film with low dielectric constant, the resin is preferably a silicon resin.

Thus, the mechanical strength of the resultant low dielectric insulating film can be further increased.

In this case, the silicon resin preferably includes organic silicon.

Thus, the mechanical strength can be increased as well as the dielectric constant can be lowered in the resultant low dielectric insulating film.

In the method for forming an insulating film with low dielectric constant, the resin is preferably an organic polymer.

Thus, the dielectric constant of the resultant low dielectric insulating film can be further lowered.

In the method for forming an insulating film with low dielectric constant, the solution preferably further includes a compound for reinforcing bond between the resin and the fine particle.

Thus, the mechanical strength of the resultant low dielectric insulating film can be further increased.

In the method for forming an insulating film with low dielectric constant, the step of annealing the substrate preferably includes a sub-step of bonding the fine particle to the resin.

Thus, the mechanical strength of the low dielectric insulating film can be further increased.

The low dielectric insulating film of this invention includes a fine particle principally composed of a silicon atom and an oxygen atom and having a large number of pores; and a resin bonded to the fine particle.

Since the low dielectric insulating film of this invention has a structure in which the resin and the fine particle having a large number of pores are bonded to each other, it attains a low dielectric constant and large mechanical strength.

In the low dielectric insulating film, the fine particle preferably has a size more than approximately 1 nm and less than approximately 30 nm.

Thus, when the low dielectric insulating film is provided between metal interconnects, an interconnect groove with a good cross-sectional shape can be formed in the low dielectric insulating film if the metal interconnects are buried interconnects, and a smooth insulating film free from a gap can be formed if the metal interconnects are patterned interconnects.

In the low dielectric insulating film, each of the pores in the fine particle preferably has a size more than approximately 0.5 nm and less than approximately 3 nm.

Thus, a large number of pores can be definitely formed within the fine particle.

In the low dielectric insulating film, the resin is preferably a silicon resin.

Thus, the mechanical strength of the low dielectric insulating film can be further increased.

In this case, the silicon resin preferably includes organic silicon.

Thus, the mechanical strength can be increased as well as the dielectric constant can be lowered in the low dielectric insulating film.

In the low dielectric insulating film, the resin is preferably an organic polymer. Thus, the dielectric constant of the low dielectric insulating film can be further lowered.

In the low dielectric insulating film, the solution preferably further includes a compound for reinforcing bond between the resin and the fine particle.

Thus, the mechanical strength of the low dielectric insulating film can be further increased.

The semiconductor device of this invention includes a plurality of metal interconnects; and an insulating film with low dielectric constant formed between the plurality of metal interconnects, and the low dielectric insulating film includes a fine particle principally composed of a silicon atom and an oxygen atom and having a large number of pores, and a resin bonded to the fine particle. The plural metal interconnects herein may be a lower metal interconnect and an upper metal interconnect or adjacent metal interconnects formed in one interconnect layer.

In the semiconductor device of this invention, even when the dielectric constant of the low dielectric insulating film is lowered, its mechanical strength is large, and therefore, cracks can be prevented from being caused in the metal interconnects.

In the semiconductor device, the fine particle preferably has a size more than approximately 1 nm and less than approximately 30 nm.

Thus, an interconnect groove with a good cross-sectional shape can be formed in the low dielectric insulating film if the metal interconnects are buried interconnects, and a smooth insulating film free from a gap can be formed if the metal interconnects are patterned interconnects.

In the semiconductor device, each of the pores in the fine particle preferably has a size more than approximately 0.5 nm and less than approximately 3 nm.

Thus, a large number of pores can be definitely formed within the fine particle.

In the semiconductor device, the resin is preferably a silicon resin.

Thus, the mechanical strength of the low dielectric insulating film can be further increased.

In this case, the silicon resin preferably includes organic silicon.

Thus, the mechanical strength can be increased as well as the dielectric constant can be lowered in the low dielectric insulating film.

In the semiconductor device, the resin is preferably an organic polymer.

Thus, the dielectric constant of the low dielectric insulating film can be further lowered.

In the semiconductor device, the low dielectric insulating film preferably further includes a compound for reinforcing bond between the resin and the fine particle.

Thus, the mechanical strength of the low dielectric insulating film can be further increased.

DETAILED DESCRIPTION OF THE INVENTION

EMBODIMENT 1

Embodiment 1 of the invention will now be described with reference to FIG. 1. In Embodiment 1, a material for forming an insulating film with low dielectric constant is embodied as a solution.

Figure 1:
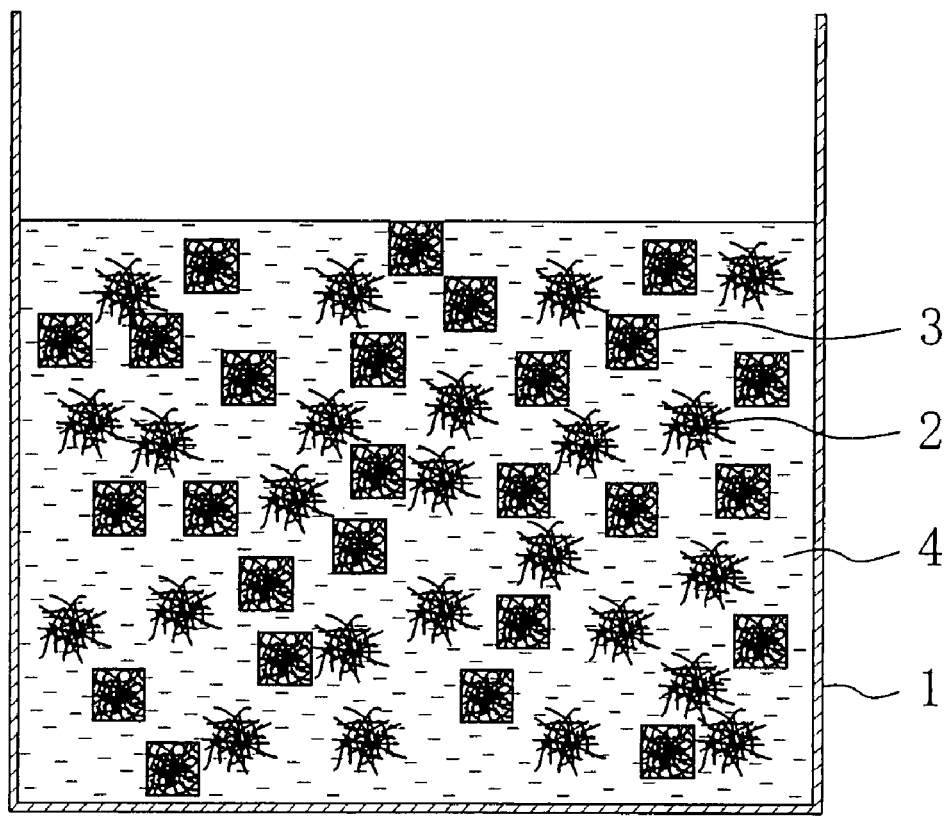
FIG. 1 is a cross-sectional view of a solution that is a material for forming an insulating film with low dielectric constant according to Embodiment 1 of the invention.

As shown in FIG. 1, the solution according to Embodiment 1 is contained in a vessel 1, and includes a silicon resin 2 corresponding to a resin, fine particles 3 each having a large number of pores and a solvent 4.

As the silicon resin 2, inorganic silicon, organic silicon or a mixture of them can be used. When organic silicon is used, the dielectric constant of a resultant low dielectric insulating film can be further lowered.

The fine particles 3 having a large number of pores are made from a compound principally formed through bonding between a silicon atom and an oxygen atom, and the pores may be communicated with or independent of one another.

First, a method for preparing the fine particles 3 having a large number of open (communicated) pores will be described.

Such fine particles 3 can be prepared by crushing mesoporous silica or a zeolite crystal with regularity such as a honeycomb structure. Alternatively, the bake temperature (the hard bake temperature) employed in forming a porous film or a porous structure described in the first or second conventional example is increased to be higher than in the first or second conventional example, so as to obtain a porous film or a porous structure in which the crosslinkage between silicon resins is reinforced, and this porous film or porous structure can be crushed to give the fine particles 3. Alternatively, colloidal silica, and spherical colloidal silica in particular, obtained through hydrolysis of alkoxysilane, such as tetramethoxysilane or tetraethoxysilane, can be used as the fine particles 3.

Next, a method for preparing the fine particles 3 having a large number of closed (independent) pores will be described.

Such fine particles can be prepared by crushing a porous film or a porous structure formed by using fine particles of an organic polymer as a porogen. Also in this case, the bake temperature employed in forming a porous film or a porous structure described in the first or second conventional example is increased to be higher than in the first or second conventional example, so as to obtain a porous film or a porous structure in which the crosslinkage between silicon resins is reinforced, and this porous film or porous structure can be crushed to give the fine particles 3. Alternatively, the fine particles 3 may have a structure in which colloidal silica, and spherical colloidal silica in particular, is adhered around an organic polymer working as a nuclear.

In either case, the fine particle 3 preferably has a size more than approximately 1 nm and less than approximately 30 nm, and each pore of the fine particle 3 preferably has a size more than approximately 0.5 nm and less than approximately 3 nm.

The solvent 4 may be a solvent that is substantially completely evaporated at the temperatures of the pre-bake and the soft bake, and examples are alcohols such as methanol, ethanol and isopropyl alcohol; and organic solvents such as cyclohexane, NMP (N-methylpyrolidone), PGMEA (propylene glycol monomethyl ether acetate), PGME (propylene glycol monomethyl ether) and PGMPE (propylene glycol monopropyl ether).

EMBODIMENT 2

Embodiment 2 of the invention will now be described with reference to FIGS. 2A and 2B. In Embodiment 2, a material for forming an insulating film with low dielectric constant is embodied as a fine particle.

Figure 2A:
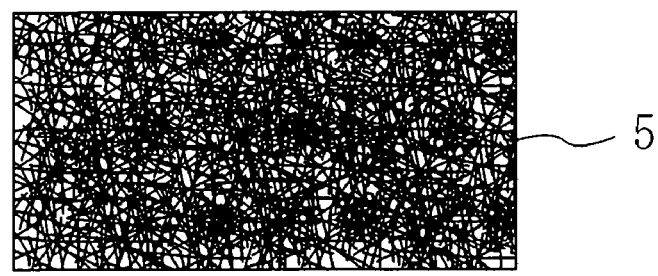
FIGS. 2A and 2B are cross-sectional views of a fine particle of a material for forming an insulating film with low dielectric constant according to Embodiment 2 of the invention.
Figure 2B:
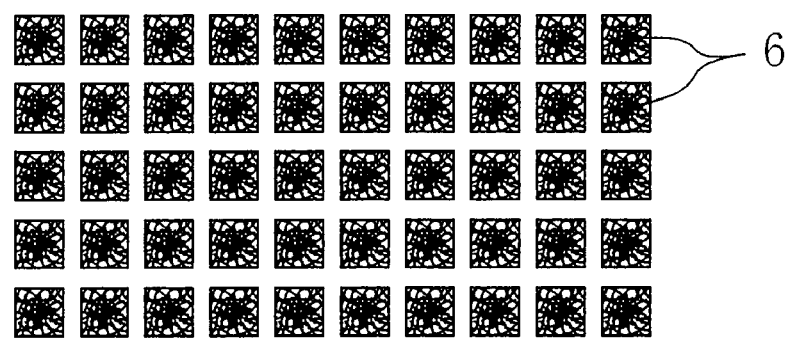

FIG. 2A shows a porous structure 5 used for preparing fine particles 6, and FIG. 2B shows the fine particles 6 prepared by crushing the porous structure 5.

The porous structure 5 has a plurality of open pores randomly distributed therein, and the fine particles 6 each having a large number of pores can be obtained by mechanically crushing the porous structure 5. In order to mechanically crush the porous structure 5, the porous structure 5 may be crushed through collision with a rapidly rotating blade or the porous structure 5 contained in a sealed vessel is allowed to collide with the inner wall of the sealed vessel. When the fine particles 6 are prepared in such a manner, the resultant fine particles are in a variety of sizes, and therefore, the fine particles 6 are preferably selected from these fine particles so as to be in a size more than approximately 1 nm and less than approximately 30 nm.

As the porous structure 5, meso-porous silica or zeolite crystal with regularity such as a honeycomb structure can be used. Alternatively, the bake temperature (the hard bake temperature) employed in forming a porous film or a porous structure described in the first or second conventional example is increased to be higher than in the first or second conventional example, so as to obtain a porous film or a porous structure in which the crosslinkage between silicon resins is reinforced, and this porous film or porous structure may be used as the porous structure 5.

Each pore of the fine particle 6 preferably has a size more than approximately 0.5 nm and less than approximately 3 nm.

EMBODIMENT 3

Embodiment 3 of the invention will now be described with reference to FIGS. 3A and 3B. In Embodiment 3, a material for forming an insulating film with low dielectric constant is embodied as a fine particle 8.

Figure 3A:
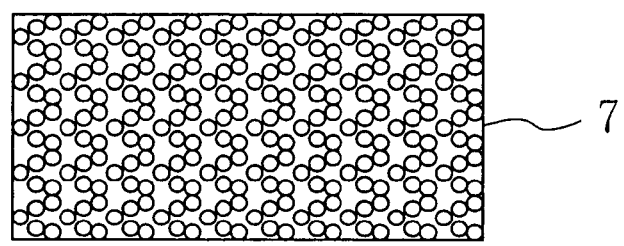
FIGS. 3A and 3B are cross-sectional views of a fine particle of a material for forming an insulating film with low dielectric constant according to Embodiment 3 of the invention.
Figure 3B:
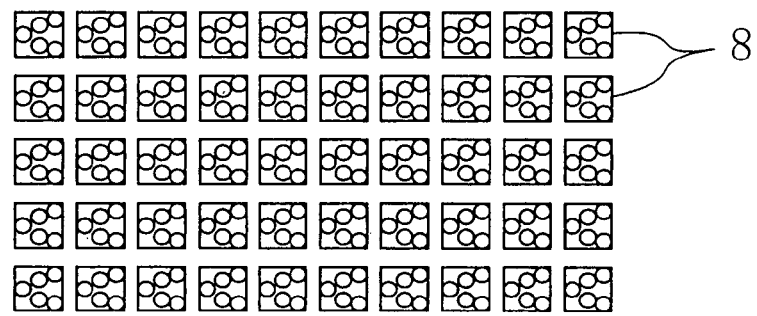

FIG. 3A shows a porous structure 7 used for preparing fine particles 8 and FIG. 3B shows the fine particles 8 prepared by crushing the porous structure 7.

The porous structure 7 has a large number of closed pores substantially uniformly dispersed therein, and the fine particles 8 each having a large number of pores can be obtained by mechanically crushing the porous structure 7. In order to mechanically crush the porous structure 7, the porous structure 7 may be crushed through collision with a rapidly rotating blade or the porous structure 7 contained in a sealed vessel is allowed to collide with the inner wall of the sealed vessel. When the fine particles 8 are prepared in such a manner, the resultant fine particles are in a variety of sizes, and therefore, the fine particles 8 are preferably selected from these fine particles so as to be in a size more than approximately 1 nm and less than approximately 30 nm.

The porous structure 7 may be a porous film or a porous structure formed by using fine particles of an organic polymer as a porogen. Also in this case, when the bake temperature is set to be higher than that employed in the first or second conventional example, the resultant porous structure 7 can attain large mechanical strength. Each pore of the fine particle 8 preferably has a size more than approximately 0.5 nm and less than approximately 3 nm.

EMBODIMENT 4

Embodiment 4 of the invention will now be described with reference to FIGS. 4A through 4C. In Embodiment 4, a material for forming an insulating film with low dielectric constant is embodied as a fine particle synthesized through a chemical reaction.

Figure 4A:
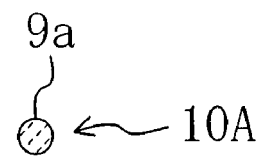
FIGS. 4A, 4B and 4C are cross-sectional views of fine particles of a material for forming an insulating film with low dielectric constant according to Embodiment 4 of the invention.

FIG. 4A shows a first fine particle 10A that is synthesized through a chemical reaction and has a large number of pores. The first fine particle 10A is a fine particle 9a of colloidal silica, and particularly spherical colloidal silica, produced through hydrolysis of alkoxysilane such as tetramethoxysilane or tetraethoxysilane, and the fine particle 9a has a large number of pores. The fine particle 9a may be a fine particle of meso-porous silica or zeolite crystal instead of the colloidal silica.

Figure 4B:
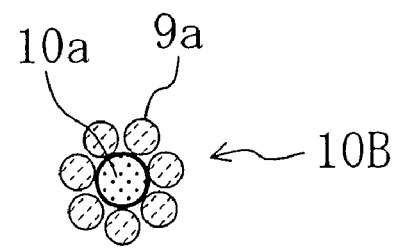

FIG. 4B shows a second fine particle 10B that is synthesized through a chemical reaction and has a large number of pores. The second fine particle 10B has a structure in which fine particles 9a each having a large number of pores are substantially uniformly adhered around an organic polymer 10a with a relatively small diameter. The fine particle 9a may be colloidal silica produced through the hydrolysis of alkoxysilane such as tetramethoxysilane or tetraethoxysilane. Alternatively, the fine particle 9a may be a fine particle of meso-porous silica or zeolite crystal instead of the colloidal silica. Furthermore, the fine particle 9a and the organic polymer 10a may be in a spherical or polyhedral shape.

Figure 4C:
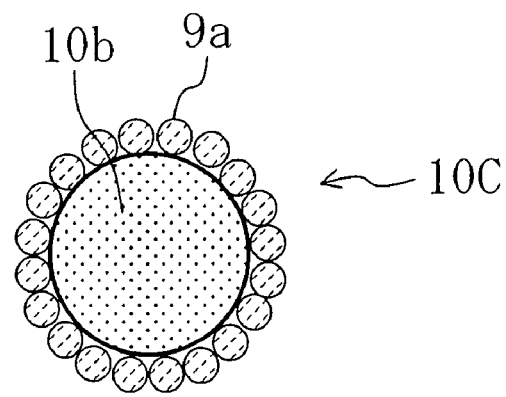

FIG. 4C shows a third fine particle 10C that is synthesized through a chemical reaction and has a large number of pores.

The third fine particle 10C has a structure in which fine particles 9a each having a large number of pores are substantially uniformly adhered around an organic polymer 10b with a relatively large diameter. The fine particle 9a may be colloidal silica produced through the hydrolysis of alkoxysilane such as tetramethoxysilane or tetraethoxysilane. Alternatively, the fine particle 9a may be a fine particle of mesoporous silica or zeolite crystal instead of the colloidal silica. Furthermore, the fine particle 9a and the organic polymer 10b may be in a spherical or polyhedral shape. Moreover, the fine particles 9a are preferably adhered around the organic polymer 10b not substantially uniformly but in special arrangement for increasing the mechanical strength of the third fine particle 10C.

The first, second or third fine particle 10A, 10B or 10C preferably has a size more than approximately 1 nm and less than approximately 30 nm, and each pore of the fine particle 9a preferably has a size more than approximately 0.5 nm and less than approximately 3 nm.

EMBODIMENT 5

Embodiment 5 of the invention will now be described with reference to FIGS. 5A through 5E. In Embodiment 5, an insulating film with low dielectric constant and a method for forming the same by using the solution according to Embodiment 1 are embodied.

Figure 5A:
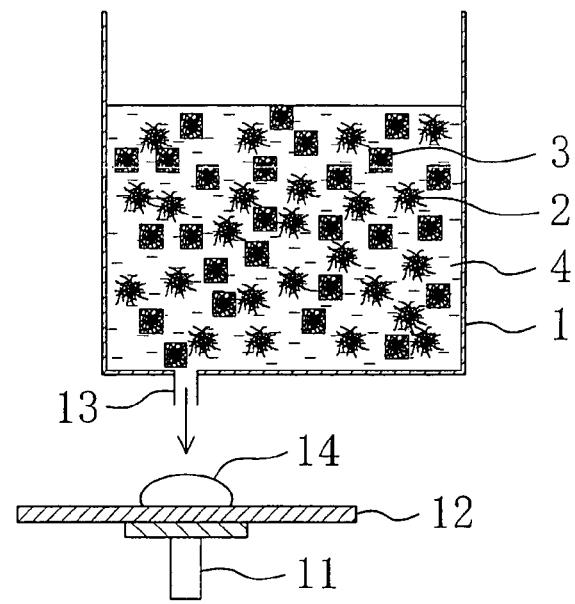
FIGS. 5A, 5B, 5C, 5D and 5E are cross-sectional views for showing procedures in a method for forming an insulating film with low dielectric constant according to Embodiment 5 of the invention.

First, as shown in FIG. 5A, the solution according to Embodiment 1 is prepared. Specifically, a solution including a silicon resin 2, fine particles 3 described in any of Embodiments 2 through 4 and a solvent 4 is contained in a vessel 1. Then, a semiconductor wafer 12 is placed on a spindle 11 connected to a rotation mechanism, and an appropriate amount of solution 14 is dropped on the semiconductor wafer 12 from a solution supply tube 13 connected to the vessel 1.

Figure 5B:
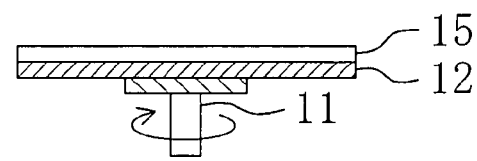

Then, as shown in FIG. 5B, the spindle 11 is rotated so as to rotate the semiconductor wafer 12, and thus, the solution 14 is spread to form a thin film 15.

Figure 5C:
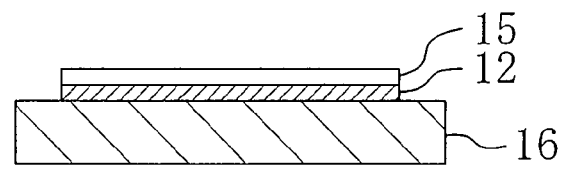

Next, as shown in FIG. 5C, the semiconductor wafer 12 on which the thin film 15 has been formed is placed on a hot plate 16 and annealed for evaporating the solvent. This procedure is generally designated as pre-bake, and is performed at a temperature of approximately 100° C. for approximately 1 through 3 minutes.

Figure 5D:
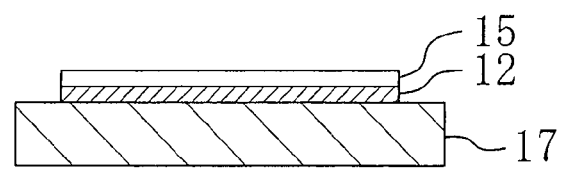

Thereafter, as shown in FIG. 5D, the semiconductor wafer 12 is placed on a hot plate 17 and annealed at a temperature of approximately 200° C. for approximately 1 through 3 minutes. This procedure is generally designated as soft bake.

Figure 5E:
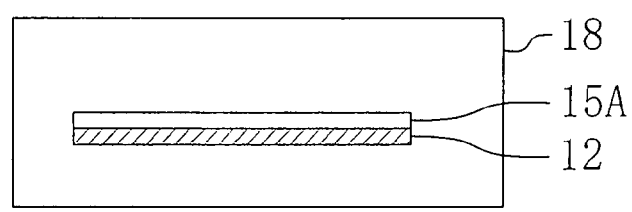

Next, as shown in FIG. 5E, after placing the semiconductor wafer 12 in an electric furnace 18, the temperature of the electric furnace 18 is increased to approximately 400° C. through 450° C., and then, annealing is performed at the highest set temperature for approximately 1 hour. This procedure is generally designated as hard bake, and when this procedure is completed, an insulating film with low dielectric constant 15A including the silicon resin 2 and the fine particles 3 is formed on the semiconductor wafer 12. The hard bake may be performed by using a hot plate. Also, annealing is preferably performed with a hot plate between the soft bake and the hard bake at an intermediate temperature between the temperatures of the soft bake and the hard bake for approximately 1 through 3 minutes.

In Embodiment 5, the silicon resin 2 is substantially stabilized in its structure because a basic siloxane structure is almost formed during the soft bake, and siloxane skeletons are crosslinked during the subsequent hard bake, so that the low dielectric insulating film 15A can be rigid and attain large mechanical strength. In other words, the silicon resins 2 are bonded to one another during the soft bake and the fine particles 3 each having a large number of pores and the silicon resin 2 are bonded to each other.

In this manner, the low dielectric insulating film 15A of Embodiment 5 has a structure in which the silicon resin 2 and the fine particles 3 having pores are rigidly bonded to each other. Accordingly, the low dielectric insulating film 15A is a porous film with toughness and large mechanical strength as compared with a siloxane structure made from a silicon resin alone.

EMBODIMENT 6

Embodiment 6 of the invention will now be described with reference to FIGS. 6A, 6B, 7A and 7B. Also in Embodiment 6, an insulating film with low dielectric constant and a method for forming the same by using the solution according to Embodiment 1 are embodied.

When an insulating film with low dielectric constant is formed by the method described in Embodiment 5, the state in which the pores are formed in the low dielectric insulating film is varied depending upon the molecular structure of the solvent. Specifically, in the case (1) where a solvent that is substantially completely evaporated through the pre-bake, such as alcohol, is used, substantially no pores other than a large number of pores present within the fine particles is formed. However, in the case (2) where a solvent that is not completely evaporated during the pre-bake but is completely evaporated during the soft bake is used and the solvent is composed of straight chain molecules or molecules with a structure approximate to a straight chain, open pores are likely to be formed in a portion corresponding to the silicon resin in addition to a large number of pores present within the fine particles. In this manner, the state of pores formed in an insulating film with low dielectric constant depends upon the kind of solvent. This will now be described with reference to FIGS. 6A and 6B.

Figure 6A:
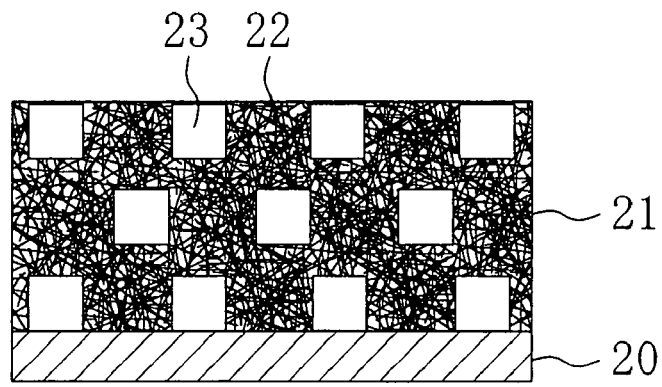
FIGS. 6A and 6B are cross-sectional views of low dielectric insulating films according to Embodiment 6 of the invention.

FIG. 6A shows the cross-sectional structure of a first low dielectric insulating film 21 formed on a semiconductor wafer 20, and the first low dielectric insulating film 21 includes a silicon resin 21 having pores and fine particles 23 each having a large number of pores. In the drawing, a white portion inside the silicon resin 21 corresponds to a pore. In the first dielectric insulating film 21, there are a large number of pores present within the fine particles 23 and open pores formed in the silicon resin 21, and hence, the first dielectric insulating film 21 is a porous film having open pores as a whole.

Figure 6B:
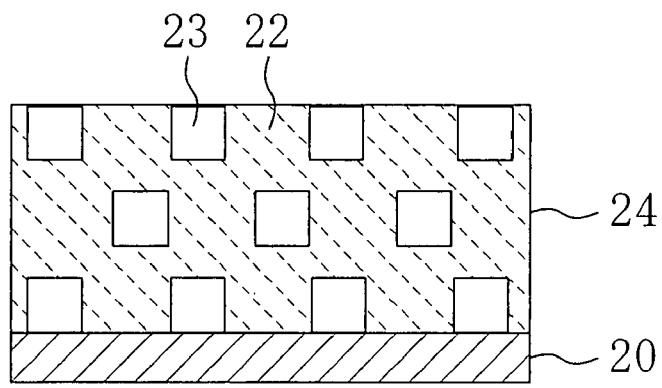

FIG. 6B shows the cross-sectional structure of a second low dielectric insulating film 24 formed on a semiconductor wafer 20, and the second low dielectric insulating film 24 includes a silicon resin 24 having no pores and fine particles 23 each having a large number of pores. In the second low dielectric insulating film 24, there is no pore in the silicon resin 24, and hence, the second low dielectric insulating film 24 is a porous film having a large number of closed pores as a whole.

Figure 7A:
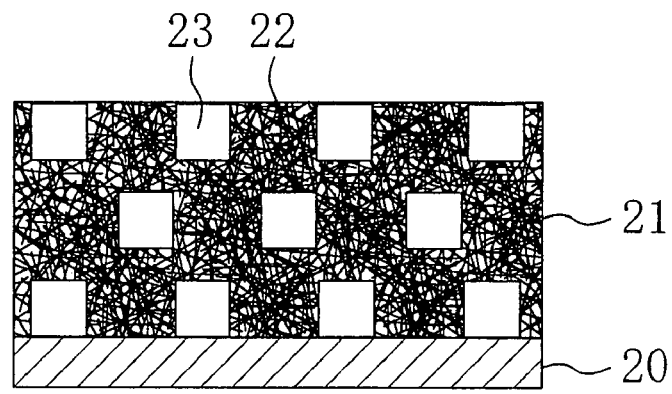
FIGS. 7A and 7B are cross-sectional views of the low dielectric insulating film according to Embodiment 6 of the invention.

FIG. 7A shows a first state of the first low dielectric insulating film 21 of FIG. 6A, and the first state is obtained by using a material for forming an insulating film with low dielectric constant in which the ratio of the fine particles 23 in the solute is lower than approximately 30 through 50 wt %. In the first state, a structure of the silicon resin 22 is the majority, the fine particles 23 having pores are present in this structure, and the structure of the silicon resin 22 is rigidly bonded to the fine particles 23 having pores. In the case where the fine particles 23 with larger mechanical strength than the silicon resin 22 are introduced into the structure of the silicon resin 22 as in the first state, the resultant film can attain much larger mechanical strength than a structure composed of the silicon resin 22 alone.

Figure 7B:
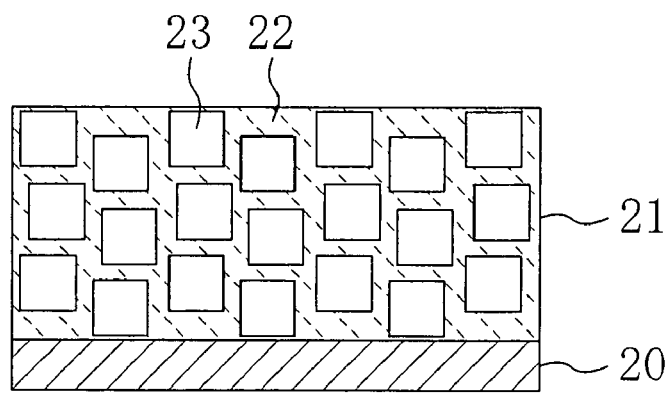

FIG. 7B shows a second state of the first low dielectric insulating film 21 of FIG. 6A, and the second state is obtained by using a material for forming an insulating film with low dielectric constant in which the ratio of the fine particles 23 in the solute is higher than approximately 30 through 50 wt %. In the second state, the fine particles 23 having pores correspond to the main skeleton of the first low dielectric insulating film 21, and the adjacent fine particles 23 are bonded to each other through a structure of the silicon resin 22. In the second state, the fine particles 23 with larger mechanical strength than the silicon resin 22 are introduced into the structure of the silicon resin 22 similarly to the first state. Therefore, the resultant film can attain much larger mechanical strength than the structure composed of the silicon resin 22 alone, and in addition, since the ratio of the fine particles 23 having pores is higher than in the first state, the low dielectric constant is further lowered.

As described so far, in the low dielectric insulating film according to Embodiment 5 or 6, fine particles each having a large number of pores are introduced into a structure of a silicon resin, and therefore, the low dielectric insulating film can be formed as a porous film having a dielectric constant as low as approximately 2.5 or less and large mechanical strength. The mechanical strength of the low dielectric insulating film according to Embodiment 5 or 6 is approximately 6 GPa or more in the Young's modulus.

In other words, in the low dielectric insulating film of Embodiment 5 or 6, the fine particles having a large number of pores and introduced for forming pores in the film do not disappear during the formation but remain in the resultant porous film and are strongly bonded to the structure of the silicon resin. Therefore, when the ratio of the fine particles having pores in the solution is increased to 30 wt % or more so as to further lower the dielectric constant by increasing the porosity of the low dielectric insulating film, the mechanical strength is not lowered differently from the case where a fullerene is used but rather increased.

When organic silicon in which silicon and an organic group such as a methyl group are bonded to each other or a silicon resin including organic silicon is used as the silicon resin, the dielectric constant of the resultant low dielectric insulating film can be further lowered.

Also, when an organic polymer such as a polymer formed through an aryl-ether bond or an aryl-aryl bond is used instead of the silicon resin, the dielectric constant of the resultant dielectric insulating film can be further lowered. This is because MSQ in a bulk has a dielectric constant of approximately 2.9 while the organic polymer in a bulk has a dielectric constant as low as 2.6. Therefore, since this relationship holds also in a porous film in which a silicon resin and an organic polymer have pores, the dielectric constant can be easily lowered by using an organic polymer instead of the silicon resin. Also, in the first state of the first low dielectric insulating film 21 shown in FIG. 7A, when a compound for reinforcing the bond between the silicon resin and the fine particles is additionally used, the mechanical strength can be further increased.

Furthermore, in the second state of the first low dielectric insulating film 21 shown in FIG. 7B, when a compound for reinforcing the bond between the fine particles included in the silicon resin is additionally used, the mechanical strength can be further increased.

An example of the compound for reinforcing the bond between the silicon resin and the fine particles is alkoxysilane. For example, two methyl groups ($CH_3-$) and two methoxy groups ($CH_3O-$) are bonded to silicon (Si) in dimethyldimethoxysilane, and therefore, the crosslinkage between the silicon resin and the fine particles can be accelerated in the soft bake and the hard bake performed in forming the film. Also, since alkoxysilane can accelerate the crosslinkage between fine particles as well as the crosslinkage between an organic polymer and fine particles, it can be suitably used as the compound for reinforcing the bond in this invention.

EMBODIMENT 7

Embodiment 7 of the invention will now be described with reference to FIG. 8. In Embodiment 7, a semiconductor device including an insulating film with low dielectric constant is embodied.

Figure 8:
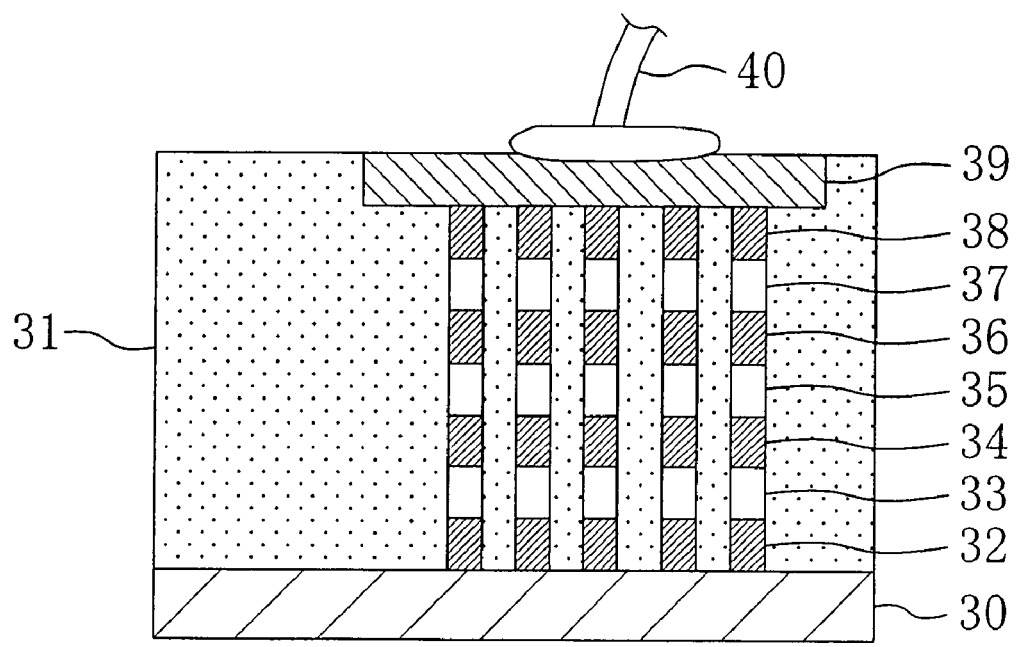
FIG. 8 is a cross-sectional view of a semiconductor device according to Embodiment 7 of the invention.
Figure 9:
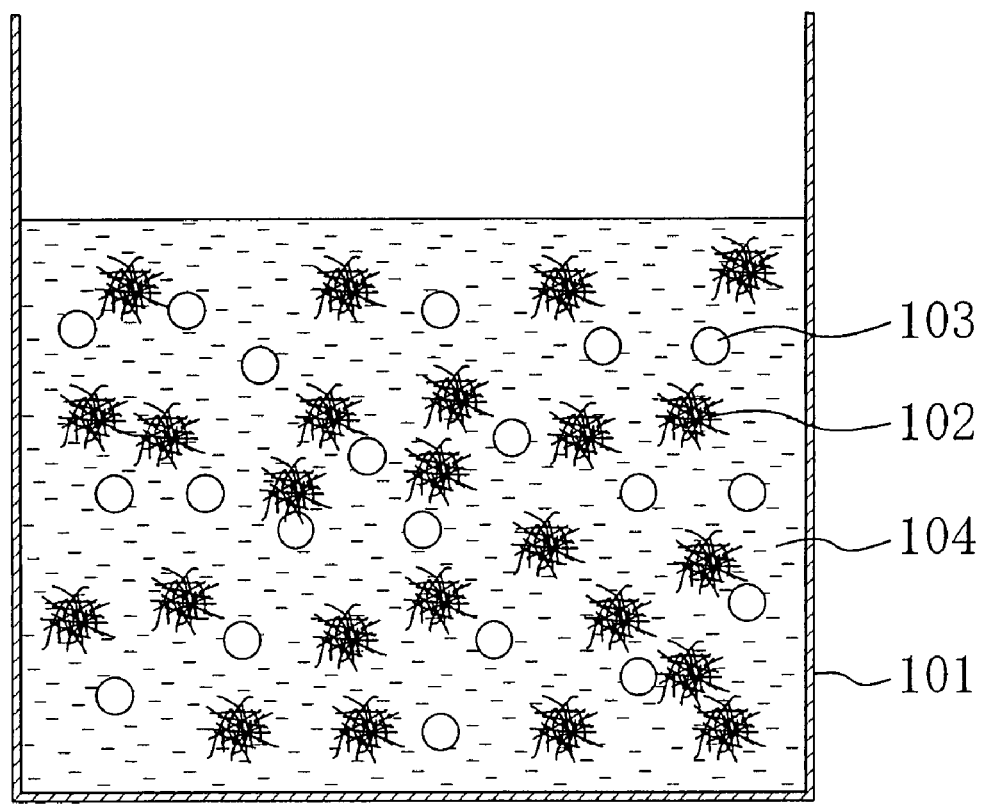
FIG. 9 is a conceptual diagram of a solution used for forming a conventional porous film.
Figure 10A:
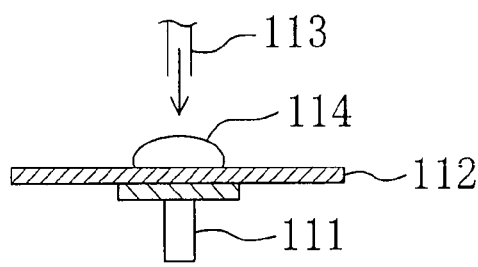
FIGS. 10A, 10B, 10C, 10D, 10E and 10F are cross-sectional views for showing procedures in a method for forming a conventional porous film.
Figure 10B:
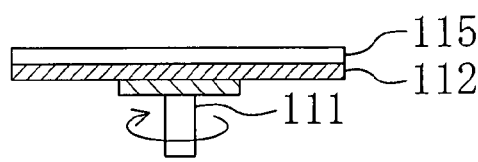
Figure 10C:
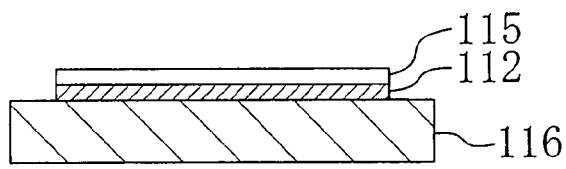
Figure 10D:
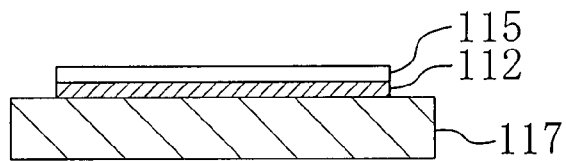
Figure 10E:
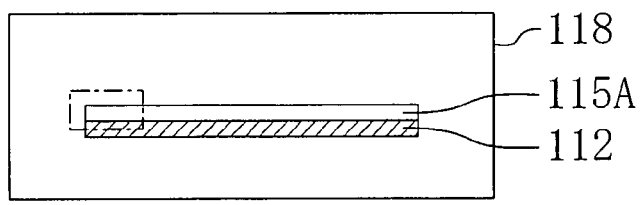
Figure 10F:
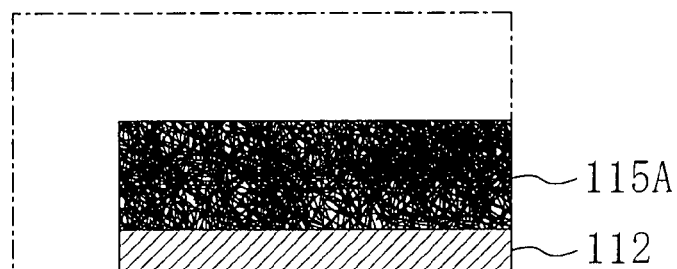
Figure 11:
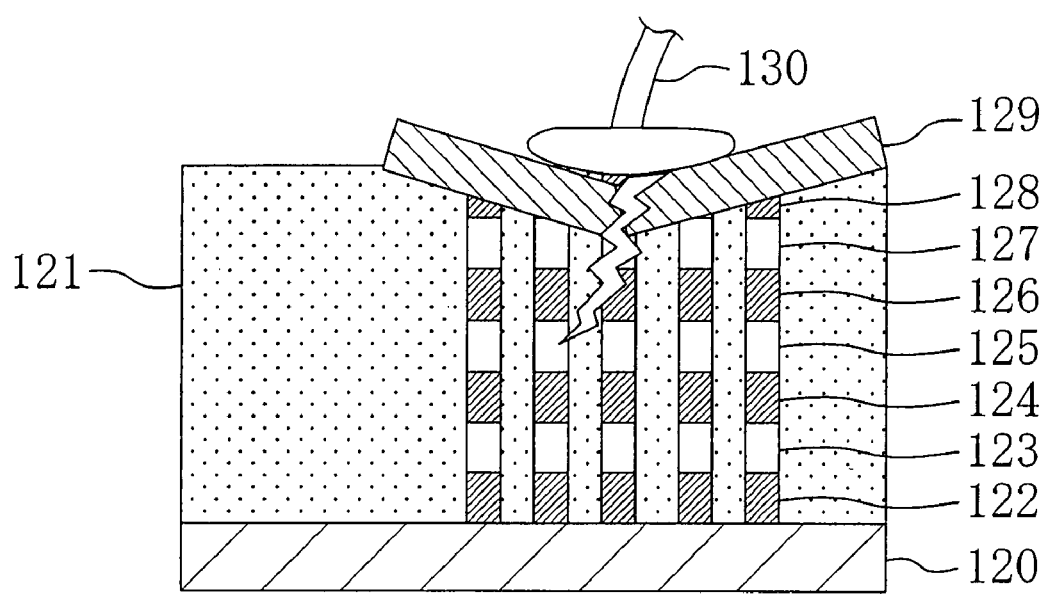
FIG. 11 is a cross-sectional view for explaining a problem occurring in a semiconductor device using the conventional porous film.

FIG. 8 shows the cross-sectional structure obtained in bonding a wire to a semiconductor device that has a multi-layer interconnect structure, for example, a three-layered interconnect structure and uses the low dielectric insulating film of Embodiment 5 or 6 as an insulating film. In FIG. 11, a reference numeral 30 denotes a semiconductor wafer, a reference numeral 31 denotes an insulating film with low dielectric constant, reference numerals 32, 34 and 36 are metal interconnects, reference numerals 33, 35, 36 and 38 denote via plugs, and a reference numeral 39 denotes a pad to be connected to an external interconnect. The metal material for the metal interconnects 32, 34 and 36 may be copper or aluminum alloy. In using copper interconnects, copper can be used for the via plugs, and in using aluminum interconnects, tungsten may be used for the via plugs.

As shown in FIG. 8, when a wire 40 is bonded to the top face of the pad 39, the semiconductor device is mounted in a package not shown.

In Embodiment 7, since the low dielectric insulating film 31 has larger mechanical strength than a conventional porous film, no cracks are caused in the pad 39 and the metal interconnects 32, 34 and 36. Also, since the low dielectric insulating film 31 has large strength for holding the metal interconnects 32, 34 and 36, the resultant semiconductor device can be stabilized.

What is claimed is:

1. A method for forming an insulating film with low dielectric constant comprising the steps of:
   forming a thin film by applying, on a substrate, a solution including a fine particle principally composed of a silicon atom and an oxygen atom, a resin including silicon and a solvent; and
   annealing said substrate for evaporating said solvent, whereby forming an insulating film with low dielectric constant out of said thin film,
   wherein the fine particle includes a pore, and
   the solution further includes alkoxysilane as a compound for reinforcing a bond between the resin and the fine particle.

2. The method for forming an insulating film with low dielectric constant of claim 1,
   wherein said fine particle has a size more than approximately 1 nm and less than approximately 30 nm.

3. The method for forming an insulating film with low dielectric constant of claim 1,
   wherein each of said pores in said fine particle has a size more than approximately 0.5 nm and less than approximately 3 nm.

4. The method for forming an insulating film with low dielectric constant of claim 1, wherein said resin includes organic silicon.

5. The method for forming an insulating film with low dielectric constant of claim 1, wherein the step of annealing said substrate includes a sub-step of bonding said fine particle to said resin.

6. The method for forming an insulating film with low dielectric constant of claim 1, wherein the fine particle is composed of a zeolite crystal.

7. The method for forming an insulating film with low dielectric constant of claim 1, wherein the compound is dimethyldimethoxysilane.

* * * * *